United States Patent [19]

Kahn

[11] Patent Number: 4,811,422

[45] Date of Patent: Mar. 7, 1989

[54] REDUCTION OF UNDESIRED HARMONIC COMPONENTS

[76] Inventor: Leonard R. Kahn, 137 E. 36 St., New York, N.Y. 10016

[21] Appl. No.: 944,360

[22] Filed: Dec. 22, 1986

[51] Int. Cl.$^4$ ............................................... H04B 1/04
[52] U.S. Cl. ..................................... 455/114; 455/103; 330/124 R; 330/126
[58] Field of Search ................................. 455/114, 103; 330/124 R, 126

[56] References Cited

U.S. PATENT DOCUMENTS 3,202,928  8/1965  Prior ..................................... 455/114
3,458,816  7/1969  O'Brien ............................... 455/114

Primary Examiner—Michael A. Masinick

[57] ABSTRACT

Reduction of undesired r.f. harmonics, generated in the highest power power amplifier of a transmitter, is achieved by providing at least one alternate path for the undesired harmonics incorporating a relatively low powered power amplifier for at least one undesired harmonic component and causing the harmonic, in this alternate path, to have an amplitude that is substantially equal and a phase 180 degrees relative to the corresponding harmonic output from the main path and combining the outputs of the paths.

9 Claims, 2 Drawing Sheets

REDUCTION OF UNDESIRED HARMONIC COMPONENTS

BACKGROUND OF THE INVENTION

This invention relates to AM, FM, TV, Radar etc., transmitters and the means for reducing the energy level of the undesired rf harmonics at the output of the transmitters. The invention is especially useful for high power transmission systems where the size and cost of conventional means for reducing the magnitude of the undesired rf harmonics can be substantial.

Radio, Radar, Television and other wireless communication and navigation systems must restrict their bandwidth so as to avoid interfering with other users of the radio spectrum. One mechanism for causing interference is by radiating rf harmonics i.e., bands of rf power centered at exact multiples of the desired radiated signal's frequency. For example, if a AM broadcast station is assigned a carrier frequency of 660 kHz its 2nd harmonic will fall at 1320 kHz and its 3rd harmonic at 1980 kHz, etc. These harmonics can, if they are of sufficient magnitude, interfere with stations which operate at, or close to, the frequency of the harmonics.

Accordingly, regulatory agencies require stations to severely limit the radiated power of such harmonics. For example, the U.S. Federal Communications Commission requires all harmonics to be 43+10 log P decibels, but not more than 80 db, below P, the unmodulated carrier power of the station in watts.

In order to achieve relatively high efficiency, high powered rf amplifiers use tubes or transistors biased to conduct current less than the full rf cycle. This non-linear operation produces significant levels of harmonics that must be greatly attenuated prior to reaching the associated antenna. The present invention provides means and methods for providing improved methods and means for providing attenuation of rf harmonics.

The conventional prior art method of attenuating harmonics is to use a bandpass filter comprising tuned circuits which are tuned to the desired frequency, generally, but not always, the fundamental frequency component. (Sometimes the final amplifier is used as a frequency multiplier, in which case the tuned circuit is tuned to the desired harmonic and the tuned circuit is used to attenuate the fundamental and the remaining undesired harmonics.) This arrangement is effective, however the amount of attenuation per tuned circuit section is limited because of a number of reasons including;

(1) The higher the selectivity factor, Q, the higher the circulating current which increases the size and cost of the inductance and capacitor in the tuned circuit.
(2) The higher the selectivity factor, the greater the attenuation of the higher frequency sidebands of the modulated wave.
(3) The higher the selectivity factor, the lower the efficiency. Thus for a single tuned circuit filter the efficiency of the tuned circuit in passing the rf wave is:

$$\text{Efficiency} = 1 - \frac{Q \text{ loaded}}{Q \text{ unloaded}}$$

where Q unloaded is the Q of the tuned circuit without the output load connected and Q loaded is the Q with the load connected. Typical values of Q unloaded are 200 to 800 and Q loaded 3 to 15. If the Q loaded is 13 a typical class C amplifier will have a 2nd harmonic down only approximately 30 db. For an Q unloaded of 260, five % of the total power is wasted.

Push-pull amplifiers are useful in reducing the level of even order harmonics, but such circuits have a tendency to be unstable and do not reduce odd order harmonics.

Other circuits, such as Pi networks, are more effective than simple tuned circuits, but the difference is not substantial enough to solve the problem.

While there are and have been a number of products in the marketplace that manually and or automatically null harmonics (for example distortion meters) no r.f. harmonics attenuator following the method and means as disclosed herein is known. It is noteworthy that the problem this invention treats was known since the very earliest days of radio engineering. Because the subject invention can save approximately 30% of manufacturing costs of high powered radio and TV transmitters, can substantially reduce the size of the overall transmitter, and can significantly reduce the amount of electric power consumed, the invention solves a long standing need and has substantial utility.

SUMMARY OF THE INVENTION

A characteristic advantage and feature of the present invention is that the attenuation of harmonics can be accomplished with higher efficiency than conventional prior art methods. Furthermore, the invention can provide attenuation of undesired sideband components with substantially less attenuation of desired sideband components.

Another advantage of the present invention is that the necessary mechanical and electrical components are substantially smaller than the components required for the conventional method. A further advantage of the present invention is that the cost of the necessary equipment is substantially lower than of methods used heretofore.

The invention is particularly suitable for attenuating harmonics in AM, FM, TV and radar transmitters, i.e. virtually all high powered transmitters.

The invention accomplishes the task of reducing the amplitude of undesired radio frequency (r.f.) harmonics by providing at least a second path, which includes a power amplifier, for the undesired r.f. harmonics and causing the harmonics in the second path to have correct amplitude and phase to substantially cancel the undesired harmonics when they are combined with the main signal in the normal path. In a preferred embodiment of the invention, the second path also incorporates means for substantially attenuating the desired r.f. signal, generally the fundamental r.f. component.

The circuitry coupling the output of an high powered final amplifier and the associated antenna has always been passive. Active circuits in such applications would have been expensive and inefficient. Thus radio engineers throughout the world have consistently used passive circuits to couple power amplifiers to antennas. In the instant invention, one or more shunt paths are provided which, because they are only required to handle undesired components that typically have been reduced to 30 or 40 db below the desired main component, can be conditioned with active circuits, or reasonable size, to help further reduce their level. In other words, the feasibility of this new method is dependent on conditioning the wave generated in the high powered amplifier so as to reduce the power of the undesired components to a small percentage of the desired output. If this processing was not performed, the power level of the undesired components would be too great to treat with active circuitry and the technique would destroy the transmitter's overall efficiency. Furthermore, the system's adjustments would be much more delicate.

Thus, the invention is only practical if the attenuation provided by the main coupling circuit, between the final power amplifier and the antenna, is at least 6 decibels (db) greater for the undesired rf harmonic components than the desired signal.

Embodiments of the invention include manually adjusted phase and amplitude correction circuits in the second path as well as embodiments that incorporate automatic phase and amplitude adjustments.

Other features and advantages of the invention will be apparent from the following description and discussion of certain typical embodiments of the invention.

DESCRIPTION OF THE PREFERRED EMBODIMENT

Figure 1:
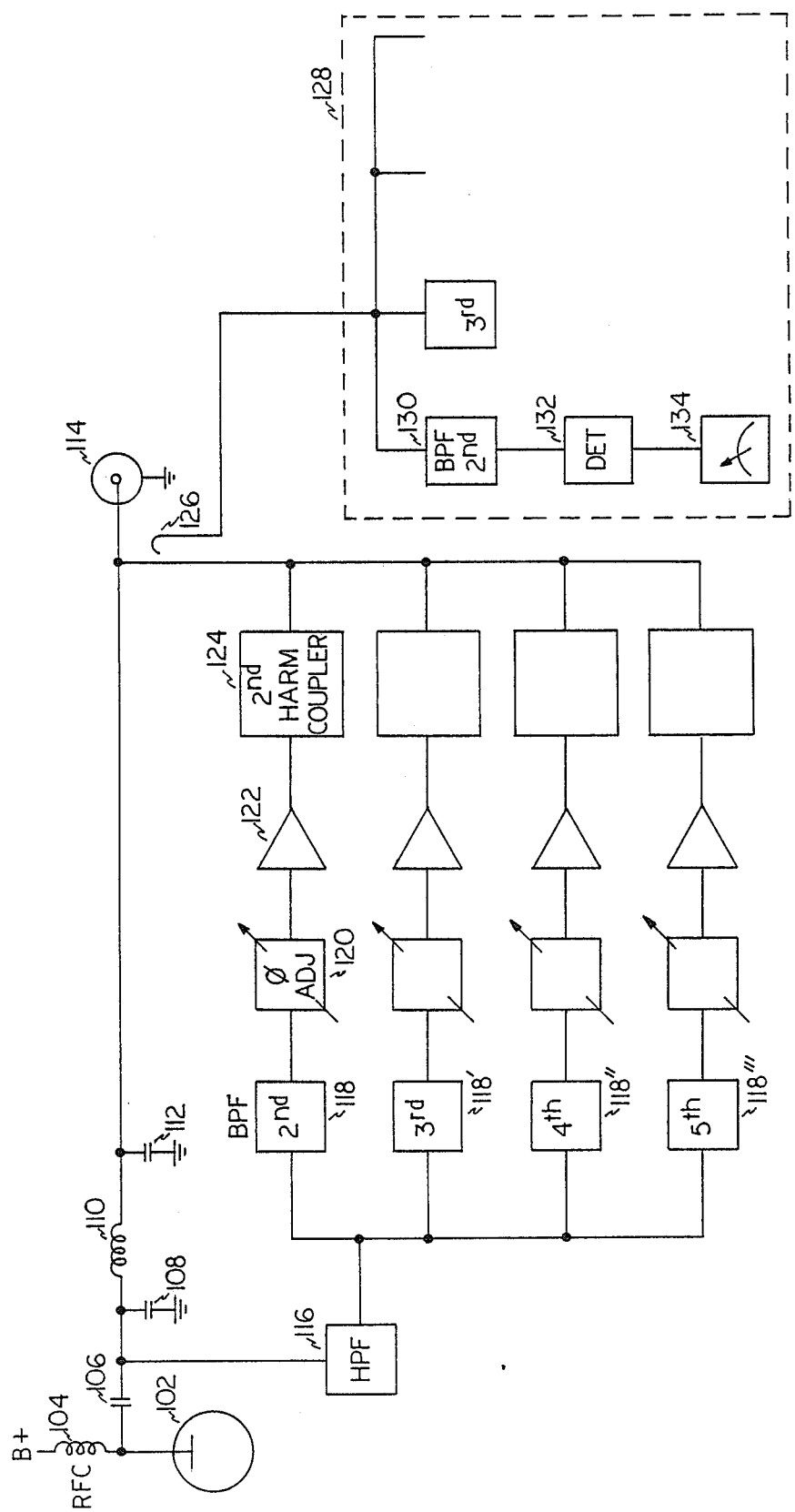
FIG. 1 is a simplified Block Diagram of one embodiment of the invention incorporating manual adjustments of the circuits for minimizing the level of undesired harmonics.

FIG. 1 shows one embodiment of the invention where the output of vacuum tube 102 comprises a desired fundamental component and undesired r.f. harmonics. The plate voltage, which may include an audio term for modulation purposes, is fed to the tube through choke, RFC 104. Coupling capacitor 106 couples the r.f. wave to a Pi network comprising capacitor 108, inductor 110 and capacitor 112. The Pi network, which provides a main path between the power amplifier tube and the antenna, serves a number of purposes, including reducing the impedance level suitable for operation of tube 102, to the load value connected to connector 114 and reducing the level of the harmonics present at the output of tube 102. While the Pi network reduces the level of the harmonics, causing the 2nd harmonic to be down in the order of 40 db below the fundamental, it is generally necessary to further attenuate at least the first few harmonics.

The output side of coupling capacitor 106 also feeds HPF (high pass filter) 116 which, assuming the desired output is the fundamental component and not a harmonic, substantially rejects the fundamental and passes the undesired harmonics. The harmonics that are above an acceptable level in the main or first path (the Pi network) are passed by bandpass filters 118, 118', 118" etc. The isolated harmonics are then phase shifted by phase shifters 120, 120', etc so as to cause the selected harmonics, to be, when they reach the output terminal, 114, substantially 180 degrees out of phase with each corresponding harmonic from the first path, i.e., through the Pi network.

The output of the phase shifters are fed through power amplifiers 122, 122', etc with adjustable power outputs so that the power that passes through each harmonic coupler 124, 124' etc. is substantially equal to the power in each harmonic as passed through the Pi network path. This causes the harmonics to be greatly attenuated and allows active elements to be incorporated in special alternate paths for undesired harmonic components. Power amplifiers 122, 122' are of different power levels, i.e. generally the lower harmonic orders, 2nd or 3rd, require higher power capability in the order of only 100 to 300 watts for a megawatt transmitter, while 4th or 5th order harmonics will require a few watts. Linear amplifiers are preferred especially if the harmonics from the main path are amplitude modulated.

In order to manually adjust the phase and amplitude of the harmonic component in the 2nd path it is convenient to provide a harmonic monitor 128 comprising bandpass filter/amplifier 130, 130' etc detector 132, 132' and meters 134, 134' etc. Monitor 128 is coupled to the output line via pick up loop 126.

Figure 2:
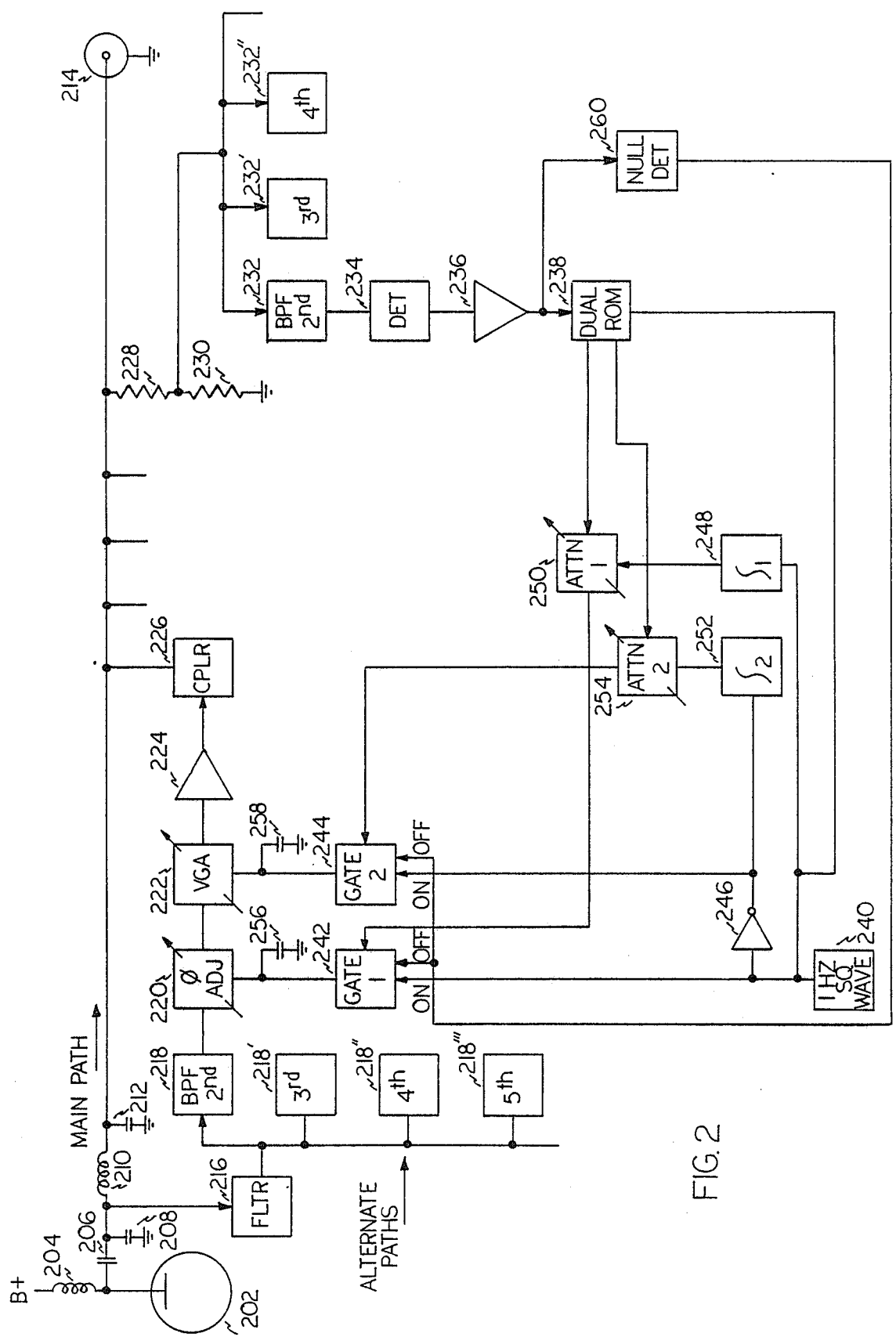
FIG. 2 is a simplified Block Diagram of another embodiment of the invention incorporating automatic minimization of the level of the undesired harmonics.

Although the circuitry discussed was designed for use of the invention for fundamental frequency operation, it will be apparent to those skilled in the art that by returning filters 116 and 118 in FIG. 1 and 216 and 218 in FIG. 2 and changing the Pi networks to favor the desired harmonic allows operation of the circuits as frequency multiplier.

FIG. 2 shows an embodiment of the invention incorporating one possible means for automatically adjusting the phase and amplitude of the second path undesired harmonics so as to best minimize the energy of the second harmonic term in the final transmitted signal. Other harmonics, of sufficient amplitude to require additional suppression, are treated in the same manner as shown for the 2nd harmonic.

Tube 202, which in one application would be a high power tube operating in a Class C mode, receives it plate voltage through an RF choke 204. Coupling capacitor 206 blocks the d.c. voltage feed to the Pi coupling circuit comprising capacitors 208, 212 and inductor, 210, a circuit that passes the fundamental component with little attenuation and greatly attenuates the rf harmonics. The Pi network in the main path also transforms the impedance of the load connected to output connector 214, generally 50 ohms, to a higher, more suitable, impedance for the operation tube 202.

Filter 216, which is also connected to the anode of vacuum tube 202 through capacitor 206, attenuates the fundamental component and feeds filters designed to pass the undesired harmonics that require additional attenuation beyond the attenuation provided by the Pi network.

Examining the operation of the means used to attenuate the 2nd harmonic component, the output of filter 216 includes the 2nd harmonic component which is passed by band pass filter 218. The output of filter 218 feeds phase shifter 220 which in turn feed variable gain amplifier 222 which then feeds power amplifier 224. Amplifier 224 is a linear amplifier that must amplify the 2nd harmonic component at a power level at the output of coupler 226 equal to the power level of the 2nd harmonic from the first path. Thus the the power produced by amplifier 224 must be high enough to accommodate the loss in coupling network 226. Thus network 226 should be tuned to the 2nd harmonic so as to minimize loss but should have high enough output impedance at the fundamental frequency so as to avoid loading the desired output component. One skilled in the applicable art will recognize there a number of different designs available for network 226 including a T circuit with arms comprised of series tuned circuit and the junction of the arms connected to a parallel tuned circuit all circuits tuned to the 2nd harmonic.

As was true of the corresponding circuits in FIG. 1, phase adjust circuit 220 and variable gain amplifier 222 circuits cause the phase to be 180 degrees out of phase with the 2nd harmonic component from main path i.e., the Pi network path and equal in amplitude. If these conditions are closely achieved the 2nd harmonic component will be greatly attenuated.

The adjustments are automatically made as follows; a sample of the output connected to connector 214 i.e., is divided by resistive divider 228 and 230. Bandpass filter 232, fed by the divider, selects the 2nd harmonic which is detected by detector 234 producing a dc voltage which is proportional to the 2nd harmonic output. The dc voltage is amplified by block 236, which in turn feeds Dual ROM circuit 228. For correction to extremely low levels, it may be desirable to incorporate amplification means between filter 232 and detector 234.

Dual read only (ROM) Block 238, which may comprise two ROMs determines, from the level of the detected 2nd harmonic, how much sweep voltage should be produced for searching for a null of the 2nd harmonic for the phase and amplitude correction of the 2nd harmonic. The necessary phase correction sensitivity information can be stored in one ROM and the information regarding the amplitude sensitivity in the second ROM. This information will allow the circuits to "zero in" for the best null in the shortest period of time and once the circuit achieves the desired specification the circuit sweeps back and forth within very small margins.

Thus when the circuit is first activated, the system will force the circuits to sweep over a large range as commanded by the large 2nd harmonic output present at the junction of resistors 228 and 230. The nulling adjustments are achieved as follows. First let us consider the phase adjust circuit. A low frequency square wave, say a 1 Hz square wave, is generated by block 240. The positive leading edge of the square wave fed to Gate 1 causing it to connect the output of attenuator 250 to the control lead of phase adjust circuit 220. The square wave at the output generator 240 is integrated by block 248 so as to produce a linearly increasing wave during the period gate 242 connects attenuator 250 to the phase adjust circuit 220. When the phase adjust circuit 220 causes the detected 2nd harmonic to go through a null ie., just as the level increases out of the null, null detector 260 switches the gate 1 off leaving the null voltage stored in capacitor 256.

Similarly VGA 222, Gate 244, attenuator 254, integrator 252 and phase inverter 246 cause the alternate period of the square wave to cause gate 2, 244 to connect VGA 222 to attenuator 254 and produce a variation in amplitude of the 2nd harmonic from path 2 to move through a null as detected by 260. This action occurs during the negative period of the square wave at the output of generator 240. When an amplitude null is achieved, the circuit operates to store the proper control voltage in capacitor 258.

As the 2nd harmonic is increasingly attenuated the output of the attenuators 250 and 254 are reduced and the accuracy of the balance improves, causing further attenuation of the 2nd harmonic.

In all cases, it is understood that the above-described arrangements are merely illustrative of the many possible specific embodiments which represent applications of the present invention. Numerous and other varied arrangements can be readily devised in accordance with the principles of the present invention without departing from the spirit and scope of the invention.

What is claimed is:

1. The method of reducing the power of undesired radio frequency (rf) harmonics produced by a transmitter incorporating a highest power power amplifier comprising the following steps:
    (a) amplifying a desired rf signal, to a selected power level in the highest power power amplifier whereby said amplified signal may contain undesired rf harmonically related components.
    (b) coupling the amplifier to an output terminal so as to provide a first, main path for the desired signal and all associated harmonics, said path attenuating the associated harmonics by at least 6 db,
    (c) providing an alternate path from the amplifier to the output for at least the harmonics that are above the harmonics that are above an acceptable level in the first path,
    (d) controlling the phase of the harmonics referred to in step (c) so as to cause them to reach the output terminal substantially 180 degrees out of phase with each corresponding harmonic from the first path, and
    (e) amplifying the harmonics of step (d) so as to cause them to reach the output terminal substantially equal in amplitude to the corresponding harmonics from the first path, thereby substantially attenuating said harmonics when they combine at the output terminal.

2. The method of reducing the power of one or more rf harmonics produced by a transmitter comprising the following steps:
    (a) power amplifying a desired rf wave, whereby the amplified signal may contain undesired rf harmonic components,
    (b) feeding the amplified signal through a first path between a power amplifier and the transmitter output connection, said first path having a frequency response that causes the desired output rf component to be at least 6 db stronger than the undesired harmonic components,
    (c) passing a sample of the amplified signal fed to the first path to at least a second path, said second path including means for favoring an undesired RF component of said signal and a relative low powered amplifying means,
    (d) causing the phase of said undesired component to be substantially 180 degrees out of phase with the undesired component from the first path at a point where the undesired components are combined,
    (e) varying the amplitude of the undesired component in the second path, so as to cause the undesired component to be substantially equal to the power of the undesired component from the first path at the point where the undesired components are combined, and
    (f) combining the outputs of the first and second paths so as to achieve at least a substantial attenuation of the undesired component.

3. The method of claim 2 wherein the phase adjustment of step (d) is performed automatically.

4. The method of claim 2 wherein the amplitude adjustment of step (e) is performed automatically.

5. The method of claim 2 wherein the phase and amplitude adjustments of steps (d) and (e) are performed automatically according to the following additional steps:

(g) feeding a sample of the output of the transmitter to filter means that cause less attenuation to the undesired component than to the desired component, (h) detecting the output of the filter means, (i) feeding part of the output resulting from (h) detecting step including a detected undesired component to a null detector, (j) gating alternately phase control circuitry and amplitude control circuitry, (k) altering the level of a control voltage fed to the means for changing the phase of the component found in the second path as an inverse function of the level of the detected undesired component, (l) gating off a control voltage to the phase control circuitry when the null detector of step (i) indicates a null, (m) storing the control voltage to the phase control circuitry when the gate disconnects a control voltage to the phase control circuitry, (n) altering the level of the control voltage fed to the means for changing the amplitude of the component favored in the second path as an inverse function of the level of the detected undesired component, (o) gating off a control voltage to the amplitude adjuster in step (n) when the null detector of step (i) indicates a null, and (p) storing the control voltage to the amplitude adjuster when the gate disconnects the control voltage to the amplitude adjuster.

6. A system for reducing the amplitude of undesired harmonics from transmitters comprising;

a first means for coupling the output of a power amplifier device to an output terminal, said coupling means producing less attenuation of a desired component than the undesired components by at least 6 db, connecting at least a second path to the input of the first coupling means, said second path comprising means for selecting an undesired component which in turn feeds phase adjusting means, and amplitude adjusting means, means for power amplifying the phase adjusted and amplitude adjusted undesired component and means for coupling the phase adjusted and amplitude adjusted undesired component to the output terminal so as to substantially reduce the energy of the undesired component at the output of the transmitter.

7. The method of reducing the power of the undesired fundamental component and undesired harmonics produced by a transmitter which utilizes a final amplifier operating as a frequency multiplier comprising the following steps:

(a) amplifying the desired harmonic to a desired power level, (b) coupling the amplifier to an output terminal so as to provide a first path for the desired harmonic and the associated undesired fundamental and undesired harmonics, said first path having at least 6 db higher attenuation for the undesired fundamental and undesired harmonics, (c) providing a second path for at least the fundamental and undesired harmonics that are above an acceptable level from the first path, (d) controlling the phase of the undesired components referred to in step (c) so as to cause them to reach the output terminal substantially 180 degrees out of phase with each corresponding undesired component from the first path and (e) amplifying the undesired components of step (c) to a power level sufficient to produce undesired components equal in amplitude to those from the first path so as to substantially cancel them at the transmitter's output terminal.

8. the method of reducing the power level of undesired rf harmonically related components comprising the following steps:

sampling one or more said undesired components at a first point ahead of circuitry through which an rf wave is passed that favors a desired component rf component relative to harmonically related components, controlling the phase of the sampled undesired components, power amplifying the sampled components, feeding the phase controlled and power amplified sampled components to a second point after circuitry that causes less attenuation of the desired component than the undesired harmonically related components where said components tend to cancel the corresponding components that would have appeared at the second point absent the phase controlled and power amplified components and where, absent the phase controlled and power amplified components, the undesired components would have been attenuated at least 6 db more than the desired components.

9. A system for reducing the amplitude of undesired radio frequency harmonically related components from transmitters comprising:

a first means for coupling the output of a power amplifier device, which produces a desired component and harmonically related undesired components, to an output terminal, said coupling means producing less attenuation of a desired component than the undesired harmonically related components by at least 6 db, connecting at least one second path to the input of the coupling device, said second path comprising means for selecting an undesired component which in turn feeds phase adjusting means, and amplitude adjusting means in cascade, means for power amplifying the phase adjusted and amplitude adjusted undesired component, and, means for coupling the amplified, phase adjusted and amplitude adjusted undesired component from the second path to the output terminal so as to substantially reduce the energy of the undesired component at the output of the transmitter.

* * * * *